US008437868B2

(12) United States Patent
Spille et al.

(10) Patent No.: US 8,437,868 B2
(45) Date of Patent: May 7, 2013

(54) METHOD FOR CODING AND DECODING THE WIDENESS OF A SOUND SOURCE IN AN AUDIO SCENE

(75) Inventors: Jens Spille, Hemmingen (DE); Jürgen Schmidt, Wunstorf (DE)

(73) Assignee: Thomson Licensing, Boulogne Billancourt (FR)

( * ) Notice: Subject to any disclaimer, the term of this patent is extended or adjusted under 35 U.S.C. 154(b) by 1140 days.

(21) Appl. No.: 10/530,881

(22) PCT Filed: Oct. 10, 2003

(86) PCT No.: PCT/EP03/11242
§ 371 (c)(1), (2), (4) Date: Apr. 11, 2005

(87) PCT Pub. No.: WO2004/036548
PCT Pub. Date: Apr. 29, 2004

(65) Prior Publication Data

US 2006/0165238 A1 Jul. 27, 2006

(30) Foreign Application Priority Data

Oct. 14, 2002 (EP) .................................... 02022866
Dec. 2, 2002 (EP) .................................... 02026770
Mar. 4, 2003 (EP) .................................... 03004732

(51) Int. Cl.
*G06F 17/00* (2006.01)
*H03G 3/00* (2006.01)

(52) U.S. Cl.
USPC .............................................. 700/94; 381/61

(58) Field of Classification Search .................... 381/17, 381/18, 1, 61, 310; 700/94
See application file for complete search history.

(56) References Cited

PUBLICATIONS

G. Potard and J. Spille: "Study of Sound Source Shape and Wideness in Virtual and Real Auditory Displays", 114th AES Convention, Mar. 22-25, 2003.

Convenor: "Coding of moving pictures and audio, ISO/IEC JTC1/SC29/WG11/N4907" Organisation Internationale De Normalisation, Jul. 2002.

H. Purnhagen: "An overview of MPEG-4 audio version 2", AES 17th International COnference on High Quality Audio Coding, Sep. 2-5, 1999.

G.Potard et al.: "Using XML schemas to create and encode interactive 3-D audio scenes for multimedia and virtual reality applications", Distributed Communities on the Web. 4th Int'l Workshop, DCW 2002, Revised Papers (Lecture Notes in Computer Science, vol. 2468), Apr. 3-5, 2002, pp. 193-203.

G. Potard and I Burnett: "A study on sound source apparent shape and wideness" Proceedings of the 2003 International Conference on Auditory Display, Jul. 6-9, 2003.

Search Report Dated Jan. 14, 2004.

*Primary Examiner* — Ping Lee

(74) *Attorney, Agent, or Firm* — Robert D. Shedd; Reitseng Lin

(57) ABSTRACT

A parametric description describing the wideness of a non-point sound source is generated and linked with the audio signal of said sound source. A presentation of said non-point sound source by multiple decorrelated point sound sources at different positions is defined. Different diffuseness algorithms are applied for ensuring a decorrelation of the respective outputs. According to a further embodiment primitive shapes of several distributed uncorellated sound sources are defined, e.g. a box, a sphere and a cylinder. The width of a sound source can also be defined by an opening-angle relative to the listener. Furthermore, the primitive shapes can be combined to do more complex shapes.

4 Claims, 4 Drawing Sheets

METHOD FOR CODING AND DECODING THE WIDENESS OF A SOUND SOURCE IN AN AUDIO SCENE

Figure 1:
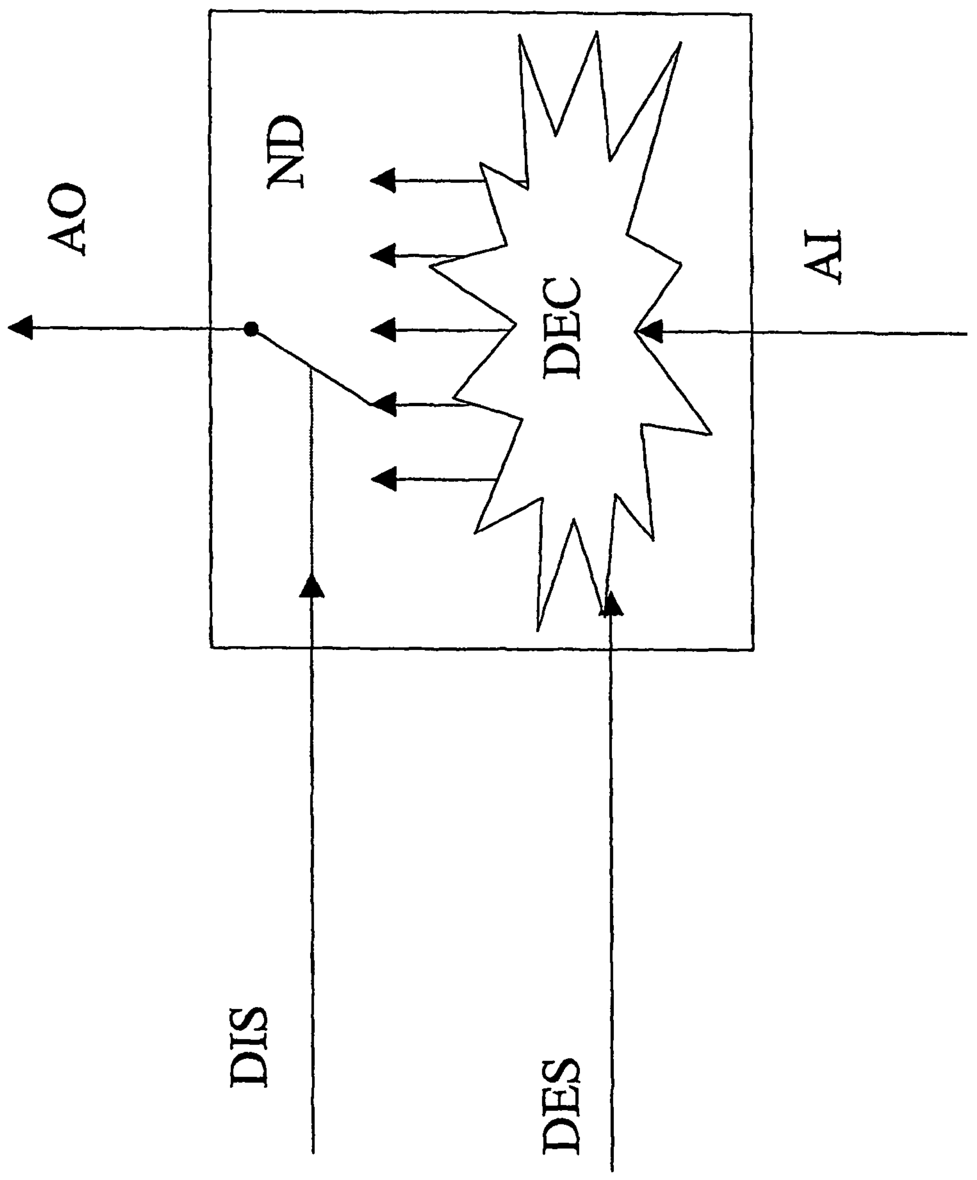

This application claims the benefit, under 35 U.S.C. §365 of International Application PCT/EP03/11242, filed Oct. 10, 2003, which was published in accordance with PCT Article 21(2) on Apr. 29, 2004 in English and which claims the benefit of European patent application No. 02022866.4, filed Oct. 14, 2002; European patent application No. 02026770.4, filed Dec. 2, 2002; and European patent application No. 03004732.8, filed Mar. 4, 2003.

The invention relates to a method and to an apparatus for coding and decoding a presentation description of audio signals, especially for describing the presentation of sound sources encoded as audio objects according to the MPEG-4 Audio standard.

BACKGROUND

MPEG-4 as defined in the MPEG-4 Audio standard ISO/IEC 14496-3:2001 and the MPEG-4 Systems standard 14496-1:2001 facilitates a wide variety of applications by supporting the representation of audio objects. For the combination of the audio objects additional information—the so-called scene description—determines the placement in space and time and is transmitted together with the coded audio objects.

For playback the audio objects are decoded separately and composed using the scene description in order to prepare a single soundtrack, which is then played to the listener.

For efficiency, the MPEG-4 Systems standard ISO/IEC 14496-1:2001 defines a way to encode the scene description in a binary representation, the so-called Binary Format for Scene Description (BIFS). Correspondingly, audio scenes are described using so-called AudioBIFS.

A scene description is structured hierarchically and can be represented as a graph, wherein leaf-nodes of the graph form the separate objects and the other nodes describes the processing, e.g. positioning, scaling, effects etc. The appearance and behavior of the separate objects can be controlled using parameters within the scene description nodes.

INVENTION

The invention is based on the recognition of the following fact. The above mentioned version of the MPEG-4 Audio standard cannot describe sound sources that have a certain dimension, like a choir, orchestra, sea or rain but only a point source, e.g. a flying insect, or a single instrument. However, according to listening tests wideness of sound sources is clearly audible.

Therefore, a problem to be solved by the invention is to overcome the above mentioned drawback. This problem is solved by the coding method disclosed in claim 1 and the corresponding decoding method disclosed in claim 3.

In principle, the inventive coding method comprises the generation of a parametric description of a sound source which is linked with the audio signals of the sound source, wherein describing the wideness of a non-point sound source is described by means of the parametric description and a presentation of the non-point sound source is defined by multiple decorrelated point sound sources.

The inventive decoding method comprises, in principle, the reception of an audio signal corresponding to a sound source linked with a parametric description of the sound source. The parametric description of the sound source is evaluated for determining the wideness of a non-point sound source and multiple decorrelated point sound sources are assigned at different positions to the non-point sound source.

This allows the description of the wideness of sound sources that have a certain dimension in a simple and backwards compatible way. Especially, the playback of sound sources with a wide sound perception is possible with a monophonic signal, thus resulting in a low bit rate of the audio signal to be transmitted. An application is for example the mono-phonic transmission of an orchestra, which is not coupled to a fixed loudspeaker layout and allows to position it at a desired location.

Advantageous additional embodiments of the invention are disclosed in the respective dependent claims.

DRAWINGS

Figure 2:
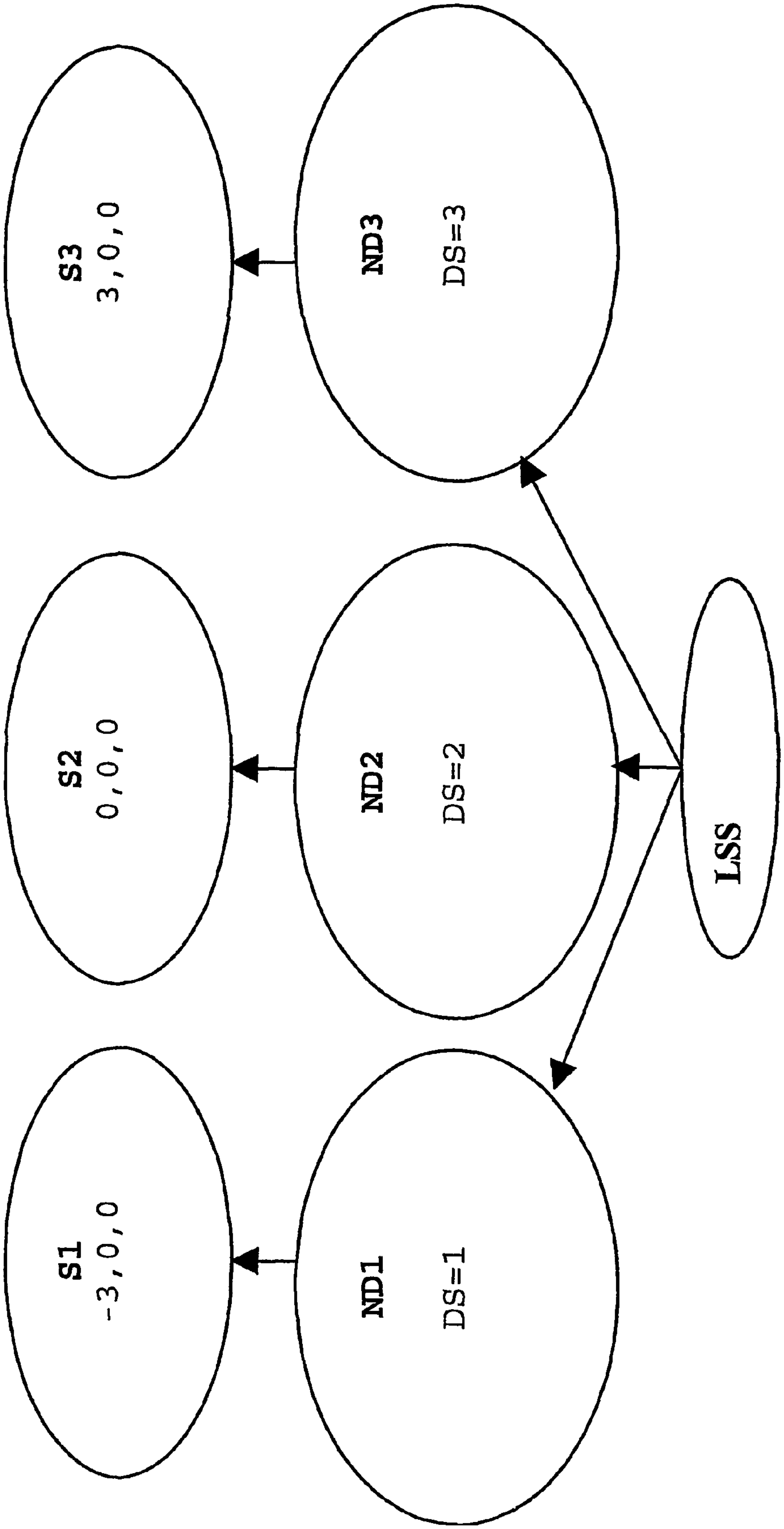
Figure 3:
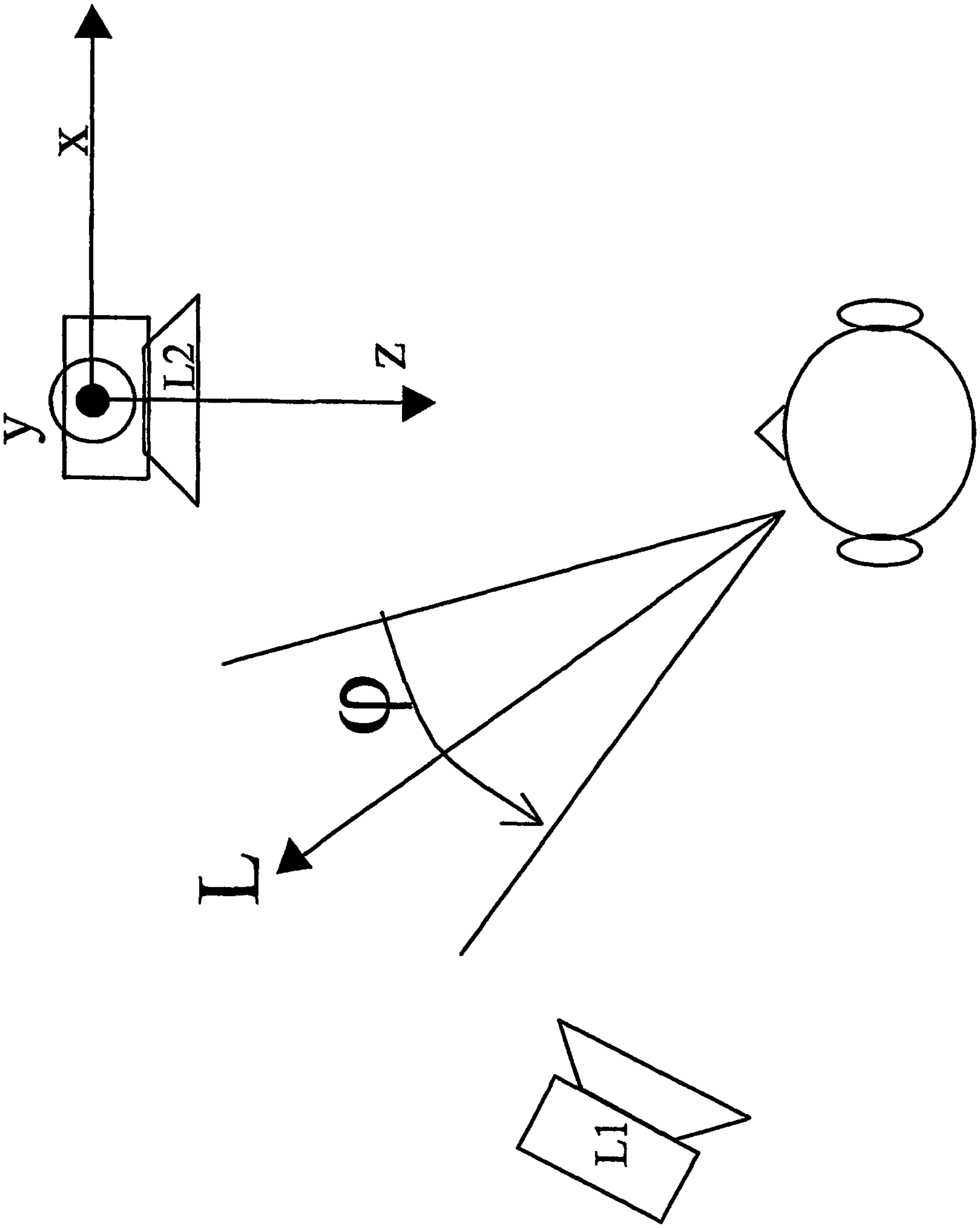
Figure 4:
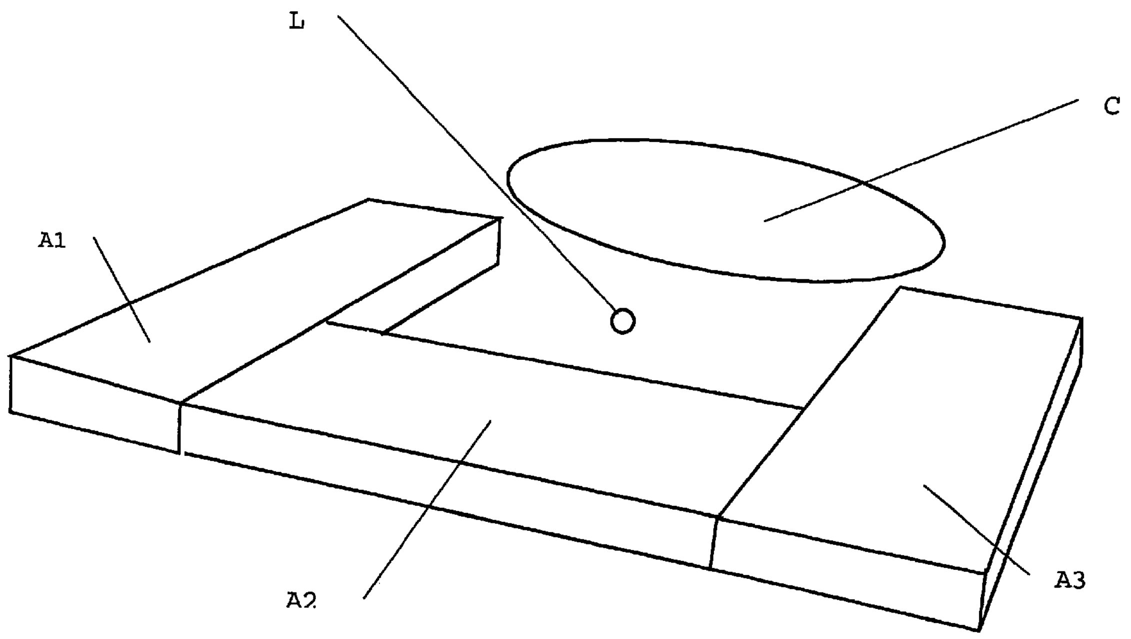

Exemplary embodiments of the invention are described with reference to the accompanying drawings, which show in FIG. 1 the general functionality of a node for describing the wideness of a sound source;

FIG. 2 an audio scene for a line sound source;

FIG. 3 an example to control the width of a sound source with an opening-angle relative to the listener;

FIG. 4 an exemplary scene with a combination of shapes to represent a more complex audio source.

EXEMPLARY EMBODIMENTS

FIG. 1 shows an illustration of the general functionality of a node ND for describing the wideness of a sound source, in the following also named AudioSpatialDiffuseness node or AudioDiffusenes node.

This AudioSpatialDiffuseness node ND receives an audio signal AI consisting of one or more channels and will produce after decorrelation DECan audio signal AO having the same number of channels as output. In MPEG-4 terms this audio input corresponds to a so-called child, which is defined as a branch that is connected to an upper level branch and can be inserted in each branch of an audio subtree without changing any other node.

A diffuseSelection field DIS allows to control the selection of diffuseness algorithms. Therefore, in case of several AudioSpatialDiffuseness nodes each node can apply a different diffuseness algorithms, thus producing different outputs and ensuring a decorrelation of the respective outputs. A diffuseness node can virtually produce N different signals, but pass through only one real signal to the output of the node, selected by the diffuseselect field. However, it is also possible that multiple real signals are produced by a signal diffuseness node and are put at the output of the node. Other fields like a field indicating the decorrelation strength DES could be added to the node, if required. This decorrelation strength could be measured e.g. with a cross-correlation function.

Table 1 shows possible semantics of the proposed AudioSpatialDiffuseness node. Children can be added or deleted to the node with the help of the addChildren field or remove—Children field, respectively. The children field contains the IDs, i.e. references, of the connected children. The diffuseSelect field and decorrestrength field are defined as scalar 32 bit integer values. The numChan field defines the number of channels at the output of the node. The phaseGroup field describes whether the output signals of the node are grouped together as phase related or not.

TABLE 1

Possible semantics of the proposed AudioSpatialDiffuseness Node

```
AudioSpatialDiffuseness   {
        eventin         MFNode     addChildren
        eventin         MFNode     removeChildren
        exposedField    MFNode     children         [ ]
        exposedField    SFInt32    diffuseSelect    1
        exposedField    SFInt32    decorreStrength  1
        field           SFInt32    numChan          1
        field           MFInt32    phaseGroup       [ ]
}
```

However, this is only one embodiment of the proposed node, different and/or additional fields are possible.

In the case of numChan greater than one, i.e. multichannel audio signals, each channel should be diffused separately.

For presentation of a non-point sound source by multiple decorrelated point sound sources the number and positions of the decorrelated multiple point sound sources have to be defined. This can be done either automatically or manually and by either explicit position parameters for an exact number of point sources or by relative parameters like the density of the point sound sources within a given shape. Furthermore, the presentation can be manipulated by using the intensity or direction of each point source as well as using the AudioDelay and AudioEffects nodes as defined in ISO/IEC 14496-1.

FIG. 2 depicts an example of an audio scene for a Line Sound Source LSS. Three point sound sources S1, S2 and S3 are defined for representing the Line Sound Source LSS, wherein the respective position is given in Cartesian coordinates. Sound source S1 is located at −3, 0, 0, sound source S2 at 0, 0, 0 and sound source S3 at 3, 0, 0. For the decorrelation of the sound sources different diffuseness algorithms are selected in the respective AudioSpatialDiffuseness Node ND1, ND2 or ND3, symbolized by DS=1, 2 or 3.

Table 2 shows possible semantics for this example. A grouping with 3 sound objects POS1, POS2, and POS3 is defined. The normalized intensity is 0.9 for POS and 0.8 for POS2 and POS3. Their position is addressed by using the 'location'-field which in this case is a 3D-vector. POS1 is localized at the origin 0, 0, 0 and POS2 and POS3 are positioned −3 and 3 units in x direction relative to the origin, respectively. The 'spatialize'-field of the nodes is set to 'true', signaling that the sound has to be spatialized depending on the parameter in the 'location'-field. A 1-channel audio signal is used as indicated by numchan 1 and different diffuseness algorithms are selected in the respective AudioSpatialDiffuseness Node, as indicated by diffuse—Select 1, 2 or 3. In the first AudioSpatialDiffuseness Node the AudioSource BEACH is defined, which is a 1-channel audio signal, and can be found at url 100. The second and third first AudioSpatialDiffuseness Node make use of the same AudioSource BEACH. This allows to reduce the computational power in an MPEG-4 player since the audio decoder converting the encoded audio data into PCM output signals only has to do the encoding once. For this purpose the renderer of the MPEG-4 player passes the scene tree to identify identical Audio-Sources.

TABLE 2

Example of a Line Sound Source replaced by three Point Sources using one single Audio-Source.

```
# Example of a line sound source replaced by three point
sources
# using one single decoder output.
Group {
    children [
        DEF POS1 Sound {
```

TABLE 2-continued

Example of a Line Sound Source replaced by three Point Sources using one single Audio-Source.

```
            intensity 0.9
            location 0 0 0
            spatialize TRUE
            source AudioSpatialDiffuseness   {
                numChan 1
                diffuseSelect   1
                children [
                    DEF BEACH AudioSource {
                        numChan 1
                        url 100
                    }
                ]
            }
        DEF POS2 Sound {
            intensity 0.8
            location −3 0 0
            spatialize TRUE
            source AudioSpatialDiffuseness   {
                numChan 1
                    diffuseSelect   2
                    children [ USE BEACH]
            }
        DEF POS3 Sound {
            intensity 0.8
            location   3 0 0
            spatialize TRUE
            source AudioSpatialDiffuseness   {
                numChan 1
                diffuseSelect 3
                children [ USE BEACH]
            }
    ]
}
```

According to a further embodiment primitive shapes are defined within the AudioSpatialDiffuseness nodes. An advantageous selection of shapes comprises e.g. a box, a sphere and a cylinder. All of these nodes could have a location field, a size and a rotation, as shown in table 3.

TABLE 3

```
SoundBox / SoundSphere / SoundCylinder {
    eventin         MFNode addChildren
    eventin         MFNode removeChildren
    exposedField       MFNode     children                 [ ]
    exposedField       MFFloat    intensity        1.0
    exposedField       SFVec3f    location                 0,0,0
    exposedField       SFVec3f    size                     2,2,2
    exposedField       SFVec3f    rotationaxis             0,0,1
    exposedField       MFFloat    rotationangle            0.0
}
```

If one vector element of the size field is set to zero a volume will be flat, resulting in a wall or a disk. If two vector elements are zero a line results.

Another approach to describe a size or a shape in a 3D coordinate system is to control the width of the sound with an opening-angle relative to the listener. The angle has a vertical and a horizontal component, 'widthHorizontal' and 'widthvertical', ranging from $0 \ldots 2\pi$ with the location as its center. The definition of the widthHorizontal component $\phi$ is generally shown in FIG. 3. A sound source is positioned at location L. To achieve a good effect the location should be enclosed with at least two loudspeakers L1, L2. The coordinate system and the listeners location are assumed as a typical configuration used for stereo or 5.1 playback systems, wherein the listener's position should be in the so-called sweet spot given by the loudspeaker arrangement. The widthvertical is similar to this with a 90-degree x-y-rotated relation.

Furthermore, the above-mentioned primitive shapes can be combined to do more complex shapes. FIG. 4 shows a scene with two audio sources, a choir located in front of a listener L and audience to the left, right and back of the listener making applause. The choir consists out of one Sound-Sphere C and the audience consists out of three SoundBoxes A1, A2, and A3 connected with AudioDiffuseness nodes.

A BIFS example for the scene of FIG. 4 looks as shown in table 4. An audio source for the SoundSphere representing the Choir is positioned as defined in the location field with a size and intensity also given in the respective fields. A children field APPLAUSE is defined as an audio source for the first SoundBox and is reused as audio source for the second and third SoundBox. Furthermore, in this case the diffuseSelect field signals for the respective SoundBox which of the signals is passed through to the output.

TABLE 4

```
## The Choir SoundSphere
    SoundSphere {
        location 0.0 0.0 −7.0          # 7 meter to the back
        size 3.0 0.6 1.5               # wide 3; height 0.6; depth 1.5
        intensity 0.9
        spatialize TRUE
        children [ AudioSource {
            numChan 1
            url 1
        }]
    }
## The audience consists out of 3 SoundBoxes
    SoundBox {                         # SoundBox to the left
        location −3.5 0.0 2.0          # 3.5 meter to the left
        size 2.0 0.5 6.0               # wide 2; height 0.5; depth 6.0
        intensity 0.9
        spatialize TRUE
        source AudioDiffusenes{
            diffuseSelect 1
            decorrStrength 1.0
            children [ DEF APPLAUSE AudioSource {
                numChan 1
                url 2
            }]
        }
    }
    SoundBox {                         # SoundBox to the rigth
        location 3.5 0.0 2.0           # 3.5 meter to the right
        size 2.0 0.5 6.0               # wide 2; height 0.5; depth 6.0
        intensity 0.9
        spatialize TRUE
        source AudioDiffusenes{
            diffuseSelect 2
            decorrStrength 1.0
            children [ USE APPLAUSE ]
        }
    }
    SoundBox {                         # SoundBox in the middle
        location 0.0 0.0 0.0           # 3.5 meter to the right
        size 5.0 0.5 2.0               # wide 2; height 0.5; depth 6.0
        direction 0.0 0.0 0.0 1.0          # default
        intensity 0.9
        spatialize TRUE
        source AudioDiffusenes{
            diffuseSelect 3
            decorrStrength 1.0
            children [ USE APPLAUSE ]
        }
    }
```

In the case of a 2D scene it is still assumed that the sound will be 3D. Therefore it is proposed to use a second set of SoundVolume nodes, where the z-axis is replaced by a single float field with the name 'depth' as shown in table 5.

TABLE 5

```
SoundBox2D / SoundSphere2D / SoundCylinder2D {
    eventin        MFNode addChildren
    eventin        MFNode removeChildren
    exposedField   MFNode    children            [ ]
    exposedField   MFFloat   intensity           1.0
    exposedField   SFVec2f   location            0,0
    exposedField   SFFloat   locationdepth       0
    exposedField   SFVec2f   size                2,2
    exposedField   SFFloat   sizedepth           0
    exposedField   SFVec2f   rotationaxis        0,0
    exposedField   SFFloat   rotationaxisdepth   1
    exposedField   MFFloat   rotationangle       0.0
}
```

The invention claimed is:

1. Method for coding a scene description of audio signals by means of a parametric description, said method comprising, generating a parametric description of a non-point sound source, wherein said parametric description includes a definition of a shape approximating said non-point sound source by multiple point sound sources, a definition of the density of said multiple point sound sources within said defined shape, and a definition of a diffuseness algorithm to be selected for decorrelation of said multiple point sound sources; and linking the parametric description of said non-point sound source with the audio signal of said non-point sound source.

2. Method according to claim 1, wherein the diffuseness algorithm is defined by a numerical value, and wherein for a first non-point sound source a first diffuseness algorithm is defined by a numerical value equal to one and for a second non-point sound source using the same audio signal a second diffuseness algorithm is defined by an incremented numerical value.

3. Method for decoding a scene description of audio signals by means of a parametric description, said method comprising, receiving an audio signal of a non-point sound source linked with a parametric description of said non-point sound source;

evaluating the received parametric description, wherein said parametric description includes a definition of a shape approximating said non-point sound source by multiple point sound sources, a definition of the density of said multiple point sound sources within said defined shape, and a definition of a diffuseness algorithm to be selected for decorrelation of said multiple point sound sources; and selecting a diffuseness algorithm for decorrelation of said multiple point sound sources from multiple different diffuseness algorithms.

4. Method according to claim 3, wherein the diffuseness algorithm is defined by a numerical value, and wherein for a first non-point sound source having a numerical value equal to one a first diffuseness algorithm is selected and for a second non-point sound source using the same audio signal and having an incremented numerical value a second diffuseness algorithm is selected.

* * * * *